United States Patent
Horii et al.

(10) Patent No.: US 9,653,297 B2
(45) Date of Patent: May 16, 2017

(54) METHOD OF MANUFACTURING SILICON CARBIDE SEMICONDUCTOR DEVICE BY FORMING METAL-FREE PROTECTION FILM

(71) Applicant: Sumitomo Electric Industries, Ltd., Osaka-shi (JP)

(72) Inventors: Taku Horii, Osaka (JP); Tomoaki Ishida, Tokyo (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/024,260

(22) PCT Filed: Aug. 5, 2014

(86) PCT No.: PCT/JP2014/070559
§ 371 (c)(1),
(2) Date: Mar. 23, 2016

(87) PCT Pub. No.: WO2015/045628
PCT Pub. Date: Apr. 2, 2015

(65) Prior Publication Data
US 2016/0225624 A1    Aug. 4, 2016

(30) Foreign Application Priority Data
Sep. 25, 2013 (JP) .................................. 2013-198555

(51) Int. Cl.
*H01L 21/04* (2006.01)
*H01L 29/16* (2006.01)
(Continued)

(52) U.S. Cl.
CPC .......... *H01L 21/046* (2013.01); *H01L 21/045* (2013.01); *H01L 21/049* (2013.01);
(Continued)

(58) Field of Classification Search
CPC ............... H01L 21/0445; H01L 21/045; H01L 21/0455; H01L 21/046; H01L 21/0465
See application file for complete search history.

(56) References Cited

U.S. PATENT DOCUMENTS

2006/0220027 A1    10/2006    Takahashi et al.
2009/0042375 A1    2/2009    Sawada et al.
(Continued)

FOREIGN PATENT DOCUMENTS

JP    H06-32814 A    2/1994
JP    2001-068428 A    3/2001
(Continued)

OTHER PUBLICATIONS

International Search Report in PCT International Application No. PCT/JP2014/070559, mailed Nov. 4, 2014.

*Primary Examiner* — Michael Jung
(74) *Attorney, Agent, or Firm* — Venable LLP; Michael A. Sartori; F. Brock Riggs

(57) ABSTRACT

A method of manufacturing a silicon carbide semiconductor device includes a step of preparing a silicon carbide substrate having a first main surface and a second main surface located opposite to the first main surface, a step of forming a doped region in the silicon carbide substrate by doping the first main surface with an impurity, a step of forming a first protecting film on the doped region at the first main surface, and a step of activating the impurity included in the doped region by annealing with the first protecting film having been formed, the step of forming a first protecting film including a step of disposing a material which will form the first protecting film and in which the concentration of a metal element is less than or equal to 5 μg/kg on the first main surface.

7 Claims, 8 Drawing Sheets

(51) Int. Cl.
   *H01L 29/66* (2006.01)
   *H01L 29/78* (2006.01)
   *H01L 29/739* (2006.01)
   *H01L 21/22* (2006.01)
   *H01L 21/02* (2006.01)

(52) U.S. Cl.
   CPC ...... H01L 21/0455 (2013.01); H01L 29/1608 (2013.01); H01L 29/66068 (2013.01); H01L 29/739 (2013.01); H01L 29/7802 (2013.01); *H01L 21/0262* (2013.01); *H01L 21/02529* (2013.01); *H01L 21/0465* (2013.01); *H01L 21/22* (2013.01)

(56) References Cited

U.S. PATENT DOCUMENTS

| | | | |
|---|---|---|---|
| 2011/0223694 A1* | 9/2011 | Uda | C23C 16/325 438/14 |
| 2012/0028453 A1* | 2/2012 | Matsuno | H01L 21/046 438/522 |
| 2012/0231618 A1* | 9/2012 | Masuda | H01L 29/66068 438/522 |
| 2013/0075759 A1* | 3/2013 | Wada | H01L 21/0475 257/77 |
| 2014/0264579 A1* | 9/2014 | Pala | H01L 29/7802 257/339 |
| 2015/0072448 A1* | 3/2015 | Kobayashi | H01L 21/26513 438/17 |
| 2016/0111499 A1* | 4/2016 | Hisamoto | H01L 21/045 257/77 |

FOREIGN PATENT DOCUMENTS

| | | |
|---|---|---|
| JP | 2005-303010 A | 10/2005 |
| JP | 2007-115875 A | 5/2007 |
| JP | 2009-065112 A | 3/2009 |
| WO | WO 2005/076327 A1 | 8/2005 |

* cited by examiner

METHOD OF MANUFACTURING SILICON CARBIDE SEMICONDUCTOR DEVICE BY FORMING METAL-FREE PROTECTION FILM

TECHNICAL FIELD

The present invention relates to silicon carbide semiconductor devices. More specifically, the present invention relates to a method of manufacturing a silicon carbide semiconductor device.

BACKGROUND ART

In recent years, a silicon carbide semiconductor device has made progress toward practical utilization as a power semiconductor device. This is because the use of a silicon carbide material for a semiconductor device is expected to increase breakdown voltage and reduce on-resistance as compared to a currently predominant semiconductor device made of a silicon material. In particular, high temperature operation taking advantage of a wide band gap semiconductor is expected of a silicon carbide semiconductor device. In the process of manufacturing such a silicon carbide semiconductor device, a semiconductor substrate is doped with an impurity by an ion implantation process, for example (see Japanese Patent Laying-Open No. 2001-68428 (PTD 1), for example).

CITATION LIST

Patent Document

PTD 1: Japanese Patent Laying-Open No. 2001-68428

SUMMARY OF INVENTION

Technical Problem

A doped region formed by an ion implantation process or the like is then activated by annealing. In this case, an annealing temperature reaches a high temperature greater than or equal to 1500° C., resulting in sublimation and the like on a surface of a substrate, which may cause surface roughness. When such surface roughness occurs, the characteristics of a semiconductor device are significantly deteriorated.

In order to address this problem, PTD 1 discloses a method of forming a protecting film on a surface of a silicon carbide substrate, followed by annealing. With this method, the sublimation can be suppressed by the protecting film, thereby preventing the surface roughness of the substrate.

A study conducted by the present inventors, however, revealed that the threshold voltage of a silicon carbide semiconductor device manufactured with the method of forming a protecting film as described above is unstable and may vary over a long period of use.

In view of the problem as described above, an object is to provide a silicon carbide semiconductor device having a stable threshold voltage.

Solution to Problem

A method of manufacturing a silicon carbide semiconductor device according to one embodiment of the present invention includes the steps of preparing a silicon carbide substrate having a first main surface and a second main surface located opposite to the first main surface, forming a doped region in the silicon carbide substrate by doping the first main surface with an impurity, forming a first protecting film on the doped region at the first main surface, and activating the impurity included in the doped region by annealing with the first protecting film having been formed, the step of forming a first protecting film including the step of disposing a material which will form the first protecting film and in which the concentration of a metal element is less than or equal to 5 µg/kg on the first main surface.

Advantageous Effects of Invention

According to above, a silicon carbide semiconductor device having a stable threshold voltage can be provided.

DESCRIPTION OF EMBODIMENTS

Figure 1:
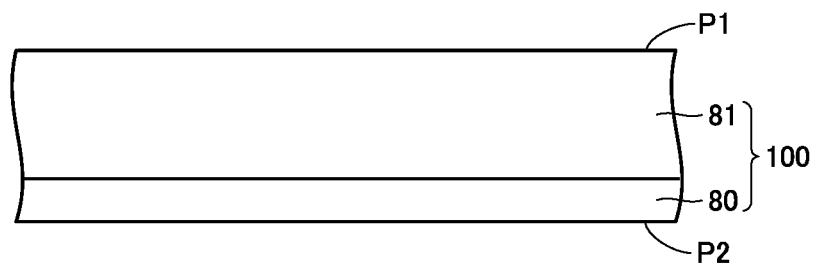
FIG. 1 is a schematic sectional view illustrating part of a method of manufacturing a silicon carbide semiconductor device of an embodiment.

An embodiment according to the present invention is described below in more detail. In the drawings of the present application, the same or corresponding parts are designated by the same reference signs and the same description will not be repeated.

DESCRIPTION OF EMBODIMENTS OF THE PRESENT INVENTION

First, an outline of the embodiment of the present invention (hereinafter also referred to as "the present embodiment") will be listed and described in (1) to (8) below.

The present inventors conducted a diligent study in order to solve the problem described above, and completed the present embodiment based on the findings that a particular component which may be included in a protecting film formed to prevent sublimation from a substrate surface is a factor contributing to threshold voltage variation in a silicon carbide semiconductor device. That is, a method of manufacturing a silicon carbide semiconductor device according to the present embodiment includes a configuration described below.

(1) The method includes a step S1 of preparing a silicon carbide substrate 100 having a first main surface P1 and a second main surface P2 located opposite to first main surface P1, a step S2 of forming a doped region in silicon carbide substrate 100 by doping first main surface P1 with an impurity, a step S3 of forming a first protecting film 10 on the doped region at first main surface P1, and a step S5 of activating the impurity included in the doped region by annealing with first protecting film 10 having been formed.

Step S3 of forming a first protecting film 10 includes a step of disposing a material which will form first protecting film 10 and in which the concentration of a metal element is less than or equal to 5 µg/kg on first main surface P1.

As described in PTD 1, for example, the concentration of a metal element in a material which will form a protecting film has not been defined in a conventional method of manufacturing a silicon carbide semiconductor device. Thus, there have been cases where a metal element is included in first protecting film 10. This metal element is diffused from first protecting film 10 into silicon carbide substrate 100 during annealing. However, since an impurity diffusion coefficient in silicon carbide substrate 100 is very low, the metal element remains in the vicinity of a surface of silicon carbide substrate 100 without being diffused into silicon carbide substrate 100. Then, the metal element remaining in the vicinity of the surface will be trapped in a gate insulating film 91 which will be formed in a subsequent step. The inclusion of the metal element in gate insulating film 91 results in a disadvantage where this metal element moves within gate insulating film 91 to cause threshold voltage variation. Although conventionally unknown, the existence of such a disadvantage is believed to have manifested itself with an increase in mobility of metal ions (mobile ions) in pursuit of high temperature operation of a silicon carbide semiconductor device.

In the present embodiment, the concentration of the metal element included in the material which will form first protecting film 10 is defined as being less than or equal to 5 µg/kg, so that the inclusion of the metal element in gate insulating film 91 can be prevented. That is, threshold voltage variation in the silicon carbide semiconductor device can be suppressed.

(2) Preferably, the density of the metal element per unit area in a surface of first protecting film 10 is less than or equal to 1E10 atoms/cm². In the present embodiment, the concentration of the metal element included in the material which will form first protecting film 10 is defined as being less than or equal to 5 µg/kg as described above. With the density of this metal element per unit area in the surface of first protecting film 10 being less than or equal to 1E10 atoms/cm² after first protecting film 10 is formed by baking the material, the threshold voltage variation can be more reliably suppressed.

(3) Preferably, first protecting film 10 is an organic film. A material which will form the organic film can be readily applied onto first main surface P1, thus reducing the burden imposed in the step. In addition, the organic film can become a carbon film by being carbonized in a temperature increasing process of annealing for activating an impurity (hereinafter referred to as "activation annealing"). This carbon film can then have heat resistance to resist activation annealing.

(4) Preferably, the metal element is sodium (Na). With the concentration of Na which may become mobile ions being limited to a low level, the threshold voltage variation can be more reliably suppressed.

(5) Preferably, the method further includes a step S4 of forming a second protecting film 20 on second main surface P2 before activating step S5, and in activating step S5, the annealing is performed with first protecting film 10 having been formed, and with second protecting film 20 also having been formed.

Forming second protecting film 20 can suppress sublimation on second main surface P2 to prevent surface roughness.

(6) Preferably, second protecting film 20 is one of an organic film, a diamond-like carbon film and a carbon layer. Using the same organic film for second protecting film 20 as that for first protecting film 10 can simplify the manufacturing steps and reduce the cost.

As second protecting film 20, a diamond-like carbon film (hereinafter referred to as a "DLC film"), a carbon layer may be used. The use of these can also suppress sublimation on second main surface P2 in a manner similar to the organic film.

Here, a DLC film can be formed by ECR (Electron Cyclotron Resonance) sputtering. A carbon layer can also be formed by partially removing silicon from silicon carbide substrate 100.

(7) Preferably, silicon carbide substrate 100 has a diameter greater than or equal to 100 mm (for example, greater than or equal to 4 inches), and silicon carbide substrate 100 has a thickness less than or equal to 600 µm.

When the sublimation occurs from second main surface P2 in a large-diameter substrate having a diameter greater than or equal to 100 mm and a thickness less than or equal to 600 µm, warpage of the substrate becomes pronounced, resulting in reduced productivity. Forming second protecting film 20 as described above can eliminate these disadvantages to significantly improve the productivity of the large-diameter substrate.

(8) Preferably, a plurality of silicon carbide substrates 100 are prepared in preparing step S1, and in activating step S5, the plurality of the silicon carbide substrates 100 are annealed while being held with spacing between each of the substrates along a direction intersecting with first main surface P1.

Conventionally, activation annealing has been performed with second main surface P2 being in close contact with a susceptor or the like in order to prevent substrate warpage and the like associated with the sublimation from second main surface P2. Therefore, a certain limitation has been imposed on the throughput in the activation annealing step. In the present embodiment, the sublimation on second main surface P2 can be prevented by forming second protecting film 20, so that silicon carbide substrates 100 can be stacked with spacing between them in the direction intersecting with first main surface P1 (for example, a longitudinal direction perpendicular to first main surface P1) for collective processing of the plurality of substrates. This can significantly improve the productivity of the silicon carbide semiconductor device.

Details of Embodiments of the Present Invention

The method of manufacturing a silicon carbide semiconductor device of the present embodiment is now described in more detail, however, the present embodiment is not thus limited.

First Embodiment

Method of Manufacturing Silicon Carbide Semiconductor Device

Figure 14:
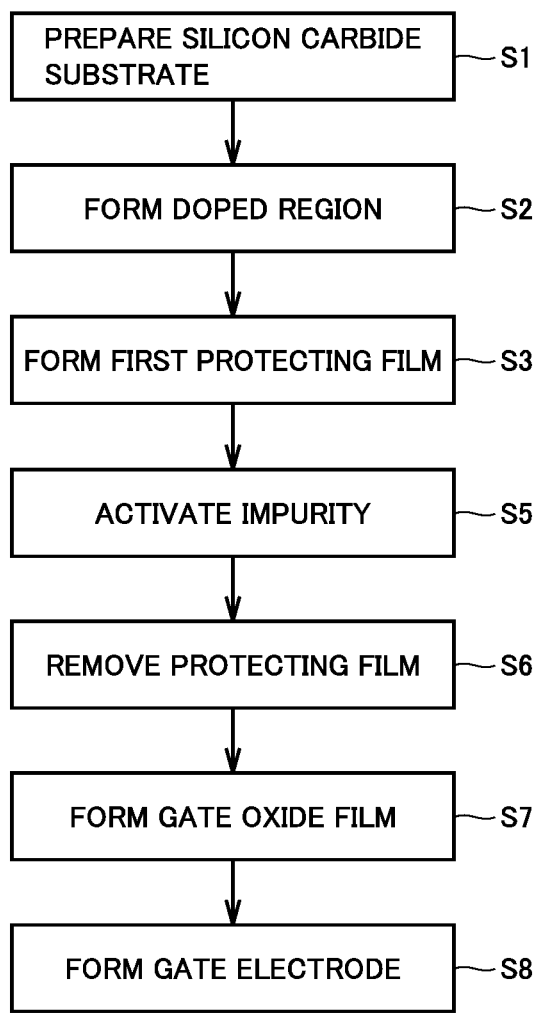
FIG. 14 is a flowchart showing an outline of a method of manufacturing a silicon carbide semiconductor device according to a first embodiment.

FIG. 14 is a flowchart showing an outline of a method of manufacturing a silicon carbide semiconductor device according to a first embodiment. As shown in FIG. 14, the method of manufacturing a silicon carbide semiconductor device of the first embodiment includes steps S1, S2, S3, S5, S6, S7 and S8. In a material which will form a first protecting film 10 formed in step S3, the concentration of a metal element is less than or equal to 5 μg/kg. This can prevent a gate insulating film 91 from including the metal element derived from this material, thus stabilizing a threshold voltage of the silicon carbide semiconductor device. The steps are now described.

<Step S1>

FIG. 1 is a schematic sectional view illustrating step S1 in the method of manufacturing a silicon carbide semiconductor device of the present embodiment. Referring to FIG. 1, a silicon carbide substrate 100 having a first main surface P1 and a second main surface P2 located opposite to first main surface P1 is prepared. Silicon carbide substrate 100 includes a silicon carbide single-crystal substrate 80 and a silicon carbide epitaxial layer 81 epitaxially grown thereon.

Silicon carbide single-crystal substrate 80 is made of, for example, hexagonal silicon carbide having a polytype of 4H. Silicon carbide single-crystal substrate 80 is prepared, for example, by slicing an ingot (not shown) made of silicon carbide single crystal. Silicon carbide single-crystal substrate 80 includes an impurity such as nitrogen (N) and has n type conductivity.

A lower surface of silicon carbide single-crystal substrate 80 constitutes second main surface P2 of silicon carbide substrate 100. An upper surface of silicon carbide single-crystal substrate 80 is a surface where epitaxial growth is performed.

Silicon carbide epitaxial layer 81 has, for example, a hexagonal crystal structure having a polytype of 4H. An upper surface of silicon carbide epitaxial layer 81 constitutes first main surface P1. Silicon carbide epitaxial layer 81 has n type conductivity, for example. The epitaxial growth of silicon carbide epitaxial layer 81 can be performed by a CVD (Chemical Vapor Deposition) process using a mixed gas of silane ($SiH_4$) and propane ($C_3H_8$) as a material gas, for example, and using hydrogen ($H_2$) as a carrier gas, for example. In doing so, it is preferable to introduce nitrogen (N) or phosphorus (P) as an impurity, for example. In this case, it is preferable to adjust an impurity concentration in silicon carbide epitaxial layer 81 such that it is lower than an impurity concentration in silicon carbide single-crystal substrate 80.

<Step S2>

Figure 5:
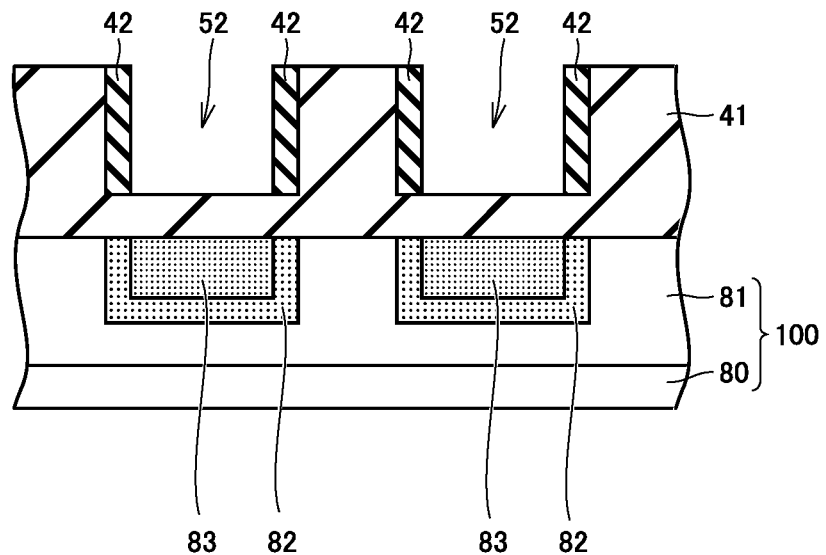
FIG. 5 is a schematic sectional view illustrating part of the method of manufacturing the silicon carbide semiconductor device of the embodiment.
Figure 6:
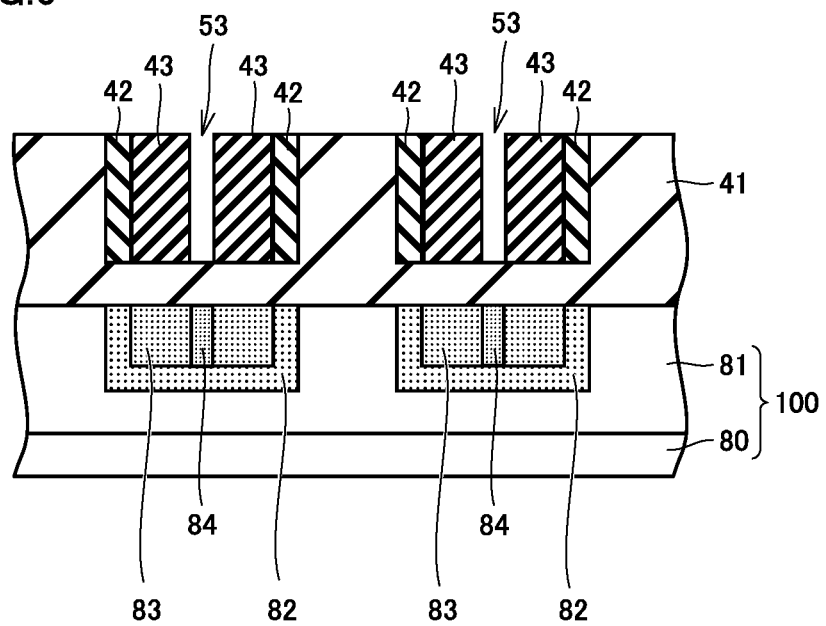
FIG. 6 is a schematic sectional view illustrating part of the method of manufacturing the silicon carbide semiconductor device of the embodiment.
Figure 7:
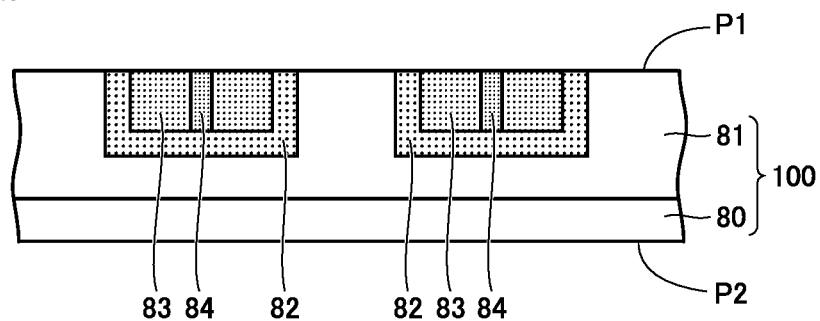
FIG. 7 is a schematic sectional view illustrating part of the method of manufacturing the silicon carbide semiconductor device of the embodiment.

FIGS. 2 to 7 are schematic sectional views illustrating step S2. Referring to FIGS. 2 to 7, a mask layer having a prescribed opening is formed on first main surface P1 and ion implantation is selectively performed, to form doped regions shown in FIG. 7 (a p body layer 82, an n+ layer 83 and a p contact region 84). While the present embodiment illustrates a method of forming the doped regions by an ion implantation process, the doped regions may be formed by epitaxial growth involving the addition of impurities. Further, the arrangement of the doped regions shown in FIG. 7 is merely exemplary and can be altered as appropriate.

Figure 2:
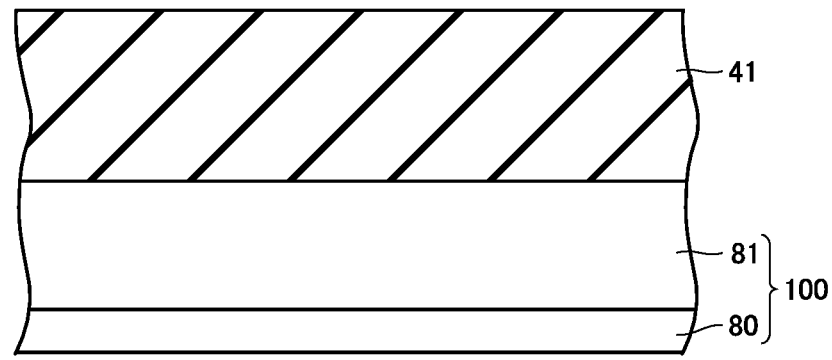
FIG. 2 is a schematic sectional view illustrating part of the method of manufacturing the silicon carbide semiconductor device of the embodiment.

First, referring to FIG. 2, a first mask layer 41 is formed on first main surface P1. First mask layer 41 is made of silicon dioxide, silicon nitride and silicon oxynitride, for example, and can be formed by a thermal CVD process and a photo CVD process, for example. A low-pressure thermal CVD process is suitable as the thermal CVD process. A silicon dioxide layer can be formed, for example, by supplying TEOS (Tetraethyl orthosilicate) gas into a chamber in which silicon carbide substrate 100 has been disposed at a flow rate of about greater than or equal to 60 sccm and less than or equal to 100 sccm and at a temperature of about greater than or equal to 600° C. and less than or equal to 800° C., and setting the pressure to be about greater than or equal to 0.8 Torr and less than or equal to 1.4 Torr.

First mask layer 41 may include a silicon dioxide layer (not shown) formed by thermal oxidation of first main surface P1, an etching stop layer (not shown) made of polysilicon, and the like. With first mask layer 41 including the etching stop layer, damage to the substrate during subsequent etching of first mask layer 41 is mitigated.

The etching stop layer made of polysilicon can be formed, for example, by supplying silane ($SH_4$) gas into the chamber in which silicon carbide substrate 100 has been disposed at a flow rate of about greater than or equal to 800 sccm and less than or equal to 1200 sccm and at a temperature of about greater than or equal to 500° C. and less than or equal to 700° C., and setting the pressure to be about greater than or equal to 0.4 Torr and less than or equal to 0.8 Torr.

Figure 3:
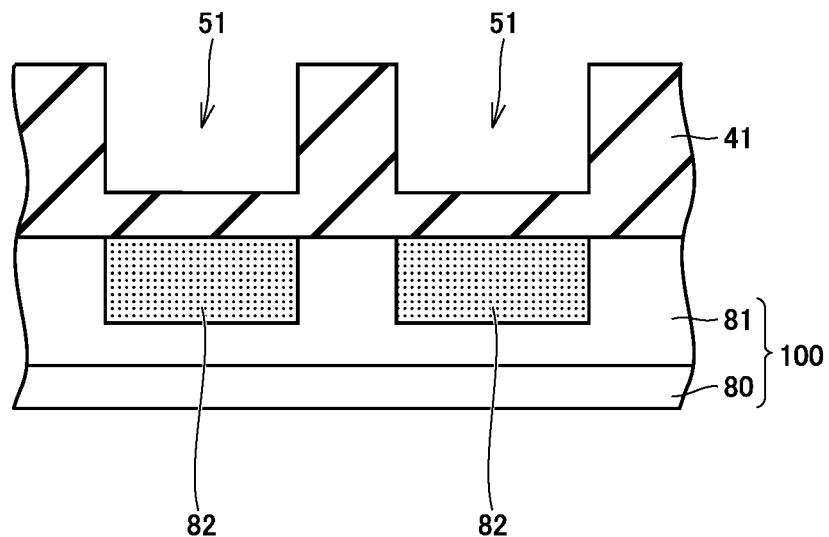
FIG. 3 is a schematic sectional view illustrating part of the method of manufacturing the silicon carbide semiconductor device of the embodiment.

Next, referring to FIG. 3, a first opening 51 is formed in first mask layer 41. First opening 51 is formed by removing a portion of first mask layer 41 by means of etching using $CF_4$ or $CHF_3$, for example. After first opening 51 is formed, ion implantation is performed through first mask layer 41 to form p body layer 82. An impurity implanted in this case is a p type impurity such as aluminum (Al) or boron (B).

Figure 4:
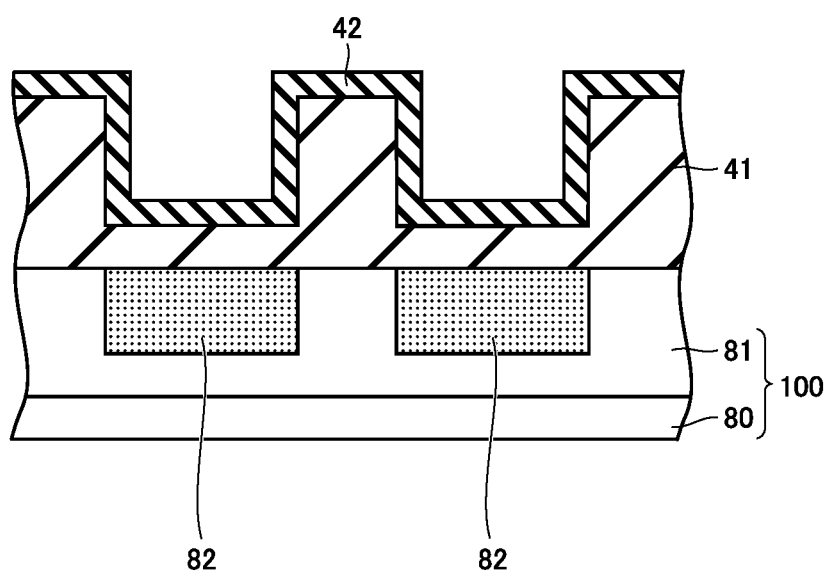
FIG. 4 is a schematic sectional view illustrating part of the method of manufacturing the silicon carbide semiconductor device of the embodiment.

Next, referring to FIG. 4, a second mask layer 42 is formed on first mask layer 41. Second mask layer 42 is a silicon dioxide layer, for example, and can be formed by a low-pressure CVD process. Then, a portion of second mask layer 42 is removed by anisotropic etching on second mask layer 42, to form a second opening 52 having a width smaller than that of first opening 51, as shown in FIG. 5. Then, ion implantation is performed through first mask layer 41 and second mask layer 42 to form n+ layer 83. An impurity implanted in this case is an n type impurity such as phosphorus (P) or nitrogen (N).

Further, referring to FIG. 6, a third mask layer 43 having a third opening 53 having a width smaller than that of second opening 52 is formed by employing a combination of layer formation and anisotropic etching. Third mask layer 43 is a silicon dioxide layer, for example, and can be formed by a low-pressure CVD process. Then, ion implantation is performed through first mask layer 41, second mask layer 42 and third mask layer 43 to form p contact region 84. An impurity implanted in this case is a p type impurity such as aluminum (Al) or boron (B).

Next, referring to FIG. 7, first mask layer 41, second mask layer 42 and third mask layer 43 are removed. If the mask layers are silicon dioxide layers, the mask layers can be removed by wet etching using hydrofluoric acid, for example. The layer made of polysilicon can be removed by dry etching, for example.

<Step S3>

Figure 8:
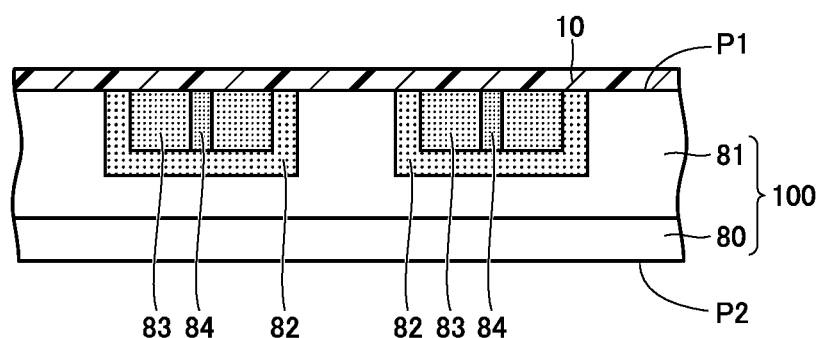
FIG. 8 is a schematic sectional view illustrating part of the method of manufacturing the silicon carbide semiconductor device of the embodiment.

FIG. 8 is a schematic sectional view illustrating step S3. Referring to FIG. 8, after the doped regions are formed in silicon carbide epitaxial layer 81, step S3 of forming first protecting film 10 on the doped regions at first main surface P1 is performed. As shown in FIG. 8, it is preferable that first protecting film 10 cover each doped region. That is, it is preferable that first protecting film 10 cover the entire portion of first main surface P1 that is utilized as a device. This is because the sublimation tends to occur particularly in a doped region. More preferably, first protecting film 10 covers substantially the entire first main surface P1. First protecting film 10 can be formed by first disposing a material which will form first protecting film 10 on first main surface P1 by any process such as application, and fixing the material by baking or the like.

It is preferable that first protecting film 10 be an organic film. An organic film including carbon atoms (C) can become a carbon film by being carbonized in a temperature increasing process of activation annealing. This carbon film can then become a protecting film that can resist activation annealing performed at a temperature exceeding 1500° C. Moreover, since the carbon atoms in the vicinity of the surface of silicon carbide epitaxial layer 81 and the carbon atoms in first protecting film 10 can be bonded together, the adhesion between silicon carbide epitaxial layer 81 and first protecting film 10 is improved, thereby efficiently preventing the sublimation of atoms from silicon carbide epitaxial layer 81.

As the organic film, various types of resins such as an acrylic resin, a phenolic resin, a urea resin, and an epoxy resin can be used. Alternatively, a resin composed as a photosensitive resin that is cross-linked or decomposed by action of light can be used. As the photosensitive resin, a positive or negative photoresist commonly used for manufacturing a semiconductor device can be used. A photoresist is suitable because the technique of applying a photoresist by a spin coating process has been established and the thickness of a photoresist can be readily controlled. If a photoresist is used, it is preferable to dispose the material on first main surface P1, then bake the material at a temperature of about 100° C. to 200° C. to vaporize a solvent, for example, to thereby fix the material.

The present embodiment, however, is different from a conventional manufacturing method in that the concentration of the metal element in the material (photoresist, for example) which will form first protecting film 10 is limited to be less than or equal to 5 μg/kg. As a result of a detailed study of the cause for threshold voltage variation, the present inventors found that a metal element had been mixed from a protecting film for preventing sublimation. A further detailed study revealed that the threshold voltage variation occurs when the concentration of the metal element exceeds 5 μg/kg. In the present embodiment, therefore, the concentration of the metal element in the material which will form first protecting film 10 is limited to be less than or equal to 5 μg/kg. More preferably, after first protecting film 10 is formed, the density of the metal element per unit area in the surface of the first protecting film is less than or equal to 1E10 atoms/cm$^2$. Thereby, the threshold voltage variation can be more reliably prevented. It is noted that "after first protecting film 10 is formed" refers to, in the case of a photoresist, for example, a state after baking at about 100° C. to 200° C. is carried out.

The thickness of first protecting film 10 is preferably greater than or equal to 0.5 μm from the viewpoint of preventing the surface roughness of first main surface P1, and preferably less than or equal to 10 μm from the viewpoint of reducing the amount of mixture of the metal element. From a similar viewpoint, the thickness of first protecting film 10 is more preferably greater than or equal to 1 μm and less than or equal to 5 μm. The thickness of first protecting film 10 can be about 3 μm, for example.

The problem as described above is believed to have existed in a conventional silicon semiconductor device as well. It is considered, however, that the problem has not manifested itself because, in the manufacture of a silicon semiconductor device, (i) doping by a thermal diffusion process instead of an ion implantation process has been mainly employed because of a high impurity diffusion coefficient, (ii) even if a metal element becomes mixed in a substrate from a protecting film, the metal element does not remain at an interface between the substrate and a gate insulating film because of a high diffusion coefficient, (iii) a general operating temperature of a silicon semiconductor device is lower than an operating temperature of a silicon carbide semiconductor device, and the like. In a silicon carbide semiconductor device, on the other hand, a metal element tends to remain at an interface between a substrate and a gate insulating film because of a low impurity diffusion coefficient. In addition, high temperature operation is expected of a silicon carbide semiconductor device. The present inventors found that the threshold voltage varies in the course of a detailed study of durability of a silicon carbide semiconductor device at a high temperature (about 200° C.).

The concentration of the metal element in the material which will form first protecting film 10 can be measured using, for example, ICP-AES (Inductively coupled plasma-Atomic Emission Spectrometry), ICP-MS (ICP-Mass Spectrometry) or the like. In addition, the density of the metal element per unit area in the surface of first protecting film 10 can be measured using, for example, a TXRF (Total reflection X-Ray Fluorescence spectrometer).

Examples of a metal element that may become a factor contributing to threshold voltage variation include sodium (Na), potassium (K), calcium (Ca), iron (Fe), nickel (Ni), copper (Cu), and zinc (Zn). Among these elements, Na particularly has a great influence on threshold voltage. It is thus preferable that the concentration of Na in the material which will form first protecting film 10 be less than or equal to 5 μg/kg. Thereby, the threshold voltage variation can be more reliably suppressed.

<Step S5>

After step S3, the impurities included in the doped regions are activated by annealing with first protecting film 10 having been formed. Thereby, desired carriers are generated in the doped regions. A temperature of the activation annealing is preferably greater than or equal to 1500° C. and less than or equal to 2000° C., and is about 1800° C., for example. The time of the activation annealing can be about 30 minutes, for example. The activation annealing is preferably performed under an inert gas atmosphere, and can be performed under an argon (Ar) atmosphere, for example.

<Step S6>

After step S5, first protecting film 10 is removed. First protecting film 10 can be removed by any process without being particularly limited. If first protecting film 10 is a photoresist, it can be removed by photoexcited ashing or plasma ashing, for example. Wet cleaning using a prescribed cleaning solution can also be used in combination with the ashing.

<Step S7>

Figure 10:
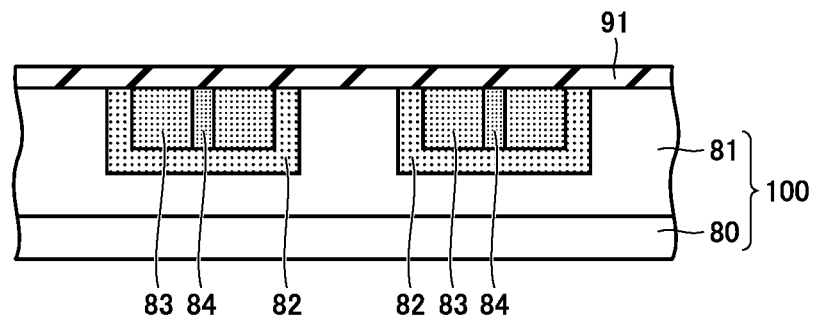
FIG. 10 is a schematic sectional view illustrating part of the method of manufacturing the silicon carbide semiconductor device of the embodiment.

Next, referring to FIG. 10, a gate insulating film 91 is formed. Gate insulating film 91 is a silicon dioxide film, for example, and is preferably formed by thermal oxidation. Gate insulating film 91 which is a silicon dioxide film can be formed, for example, by heating silicon carbide substrate 100 to about 1300° C. in an atmosphere including oxygen. After gate insulating film 91 is formed, NO annealing using nitrogen monoxide (NO) gas as an atmospheric gas may be performed. The NO annealing is performed, for example, at a temperature greater than or equal to 1100° C. and less than or equal to 1300° C. and continues for about one hour.

<Step S8>

Figure 11:
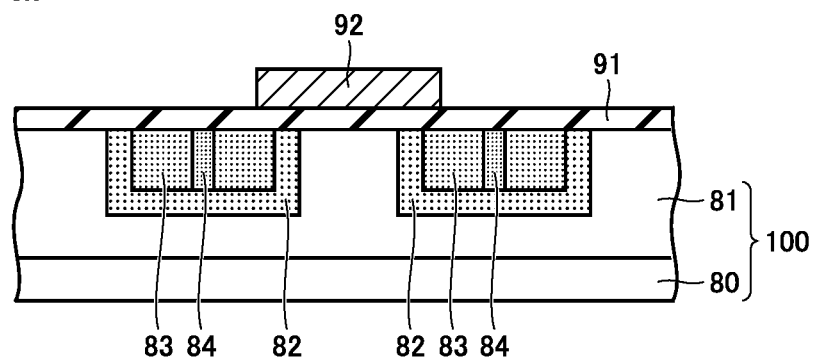
FIG. 11 is a schematic sectional view illustrating part of the method of manufacturing the silicon carbide semiconductor device of the embodiment.

Next, referring to FIG. 11, a gate electrode 92 is formed. Gate electrode 92 is formed on gate insulating film 91. Gate electrode 92 is made of polysilicon including an impurity such as phosphorus, and can be formed by a low-pressure CVD process. Gate electrode 92 is formed on gate insulating film 91 so as to face p body layer 82 and n+ layer 83. Then, an interlayer insulating film 93 is formed by a plasma CVD process, for example, in contact with gate electrode 92 and gate insulating film 91 so as to surround gate electrode 92. Interlayer insulating film 93 is made of silicon dioxide, for example.

Figure 12:
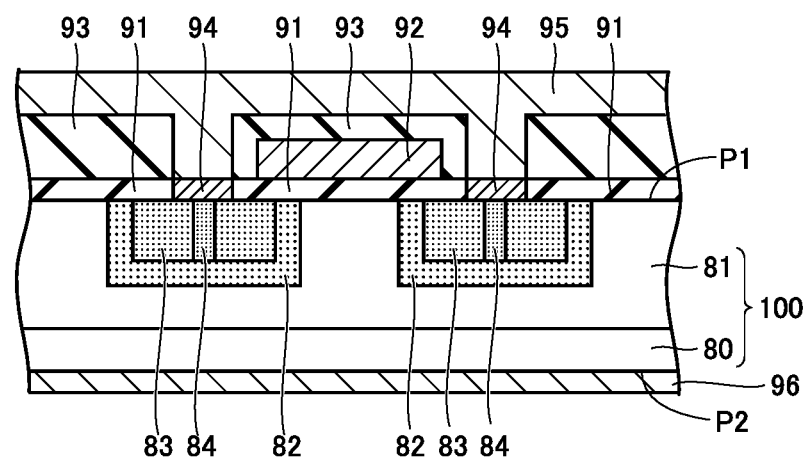
FIG. 12 is a schematic sectional view illustrating part of the method of manufacturing the silicon carbide semiconductor device of the embodiment.

Next, a post process is described with reference to FIG. 12. Gate insulating film 91 and interlayer insulating film 93 that have been formed to face n+ layer 83 and p contact region 84 are removed by dry etching, for example. Further, a metal film including titanium (Ti), aluminum (Al) and silicon (Si), for example, is formed by sputtering in contact with n+ layer 83, p contact region 84 and gate insulating film 91. Subsequently, silicon carbide substrate 100 having this metal film formed thereon is heated to about 1000° C., for example, to alloy the metal film, thereby forming a source electrode 94 in ohmic contact with silicon carbide substrate 100. Further, a source wiring layer 95 is formed so as to be electrically connected to source electrode 94. Source wiring layer 95 includes aluminum, for example, and may be formed to cover interlayer insulating film 93. Moreover, a drain electrode 96 is formed in contact with second main surface P2 of silicon carbide substrate 100.

In this manner, a silicon carbide semiconductor device having a stable threshold voltage can be provided.

While a planar MOSFET (Metal Oxide Semiconductor Field Effect Transistor) has been described by way of example as the silicon carbide semiconductor device in the present embodiment, the silicon carbide semiconductor device may be a trench MOSFET. Alternatively, the silicon carbide semiconductor device may be an IGBT (Insulated Gate Bipolar Transistor) or an SBD (Schottky Barrier Diode), for example.

Second Embodiment

Figure 15:
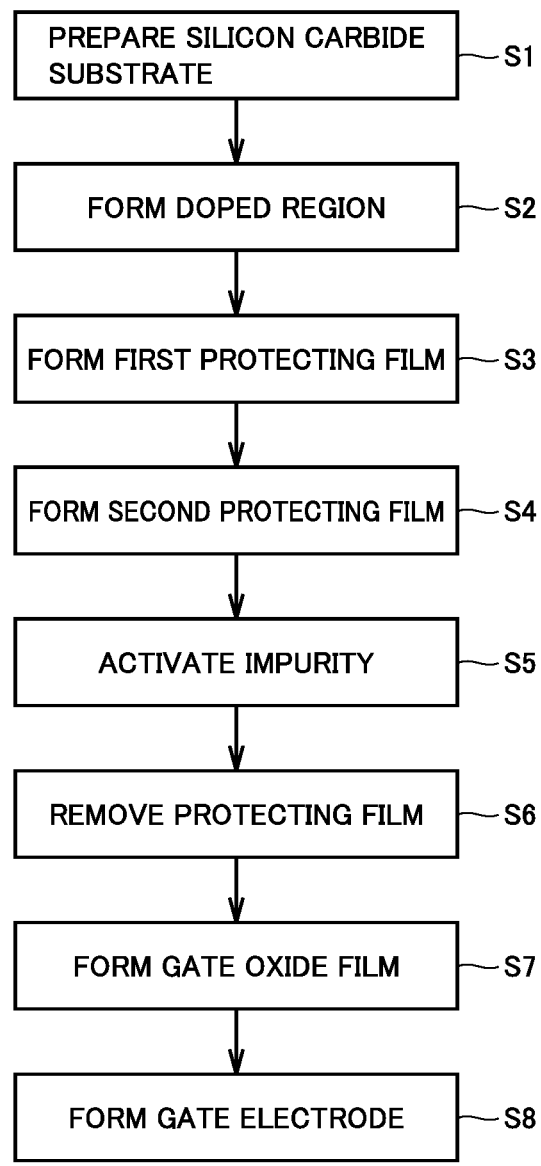
FIG. 15 is a flowchart showing an outline of a method of manufacturing a silicon carbide semiconductor device according to a second embodiment.

Next, a method of manufacturing a silicon carbide semiconductor device according to a second embodiment is described. As shown in FIG. 15, the method of manufacturing a silicon carbide semiconductor device according to the second embodiment is different from the method of manufacturing a silicon carbide semiconductor device according to the first embodiment in that it includes a step S4 of forming a second protecting film 20. The other steps S1, S2, S3, S5, S6, S7 and S8 are the same as the contents described in the first embodiment, and thus the same description will not be repeated. In the second embodiment, second protecting film 20 is formed in addition to first protecting film 10, so that the threshold voltage of the silicon carbide semiconductor device can be stabilized and the disadvantages such as substrate warpage can be suppressed. Step S4 is now described.

<Step S4>

Figure 9:
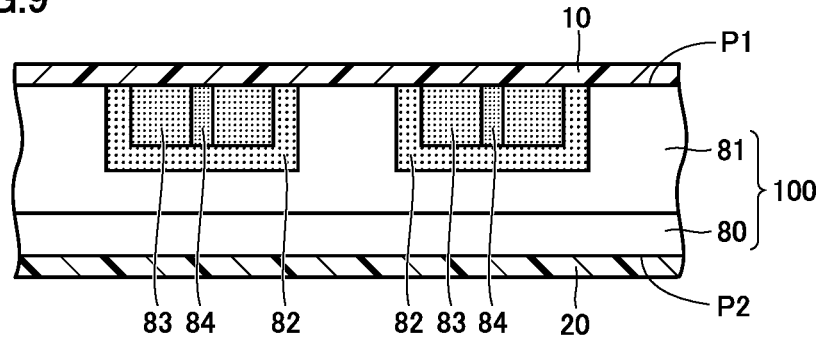
FIG. 9 is a schematic sectional view illustrating part of the method of manufacturing the silicon carbide semiconductor device of the embodiment.

FIG. 9 is a schematic sectional view illustrating step S4. The second embodiment further includes step S4 of forming second protecting film 20 on second main surface P2 before activating step S5, and as shown in FIG. 9, in activating step S5, the activation annealing is performed with first protecting film 10 having been formed, and with second protecting film 20 also having been formed. While FIG. 15 illustrates a flowchart in which step S4 is performed after step S3, step S4 is only required to be performed before step S5, and may be performed at any timing as long as it is before step S5.

It is particularly preferable to form second protecting film 20 in at least one of the cases where silicon carbide substrate 100 has a diameter greater than or equal to 100 mm (for example, greater than or equal to 4 inches), and where silicon carbide substrate 100 has a thickness less than or equal to 600 μm. In the course of the study of a factor influencing threshold voltage variation, the present inventors found that the sublimation from the substrate which had been believed to occur exclusively on the first main surface P1 side occurred on the second main surface P2 (that is, backside surface) side as well. It was revealed that this tendency is pronounced in a large-diameter substrate, and a further reduction in thickness of the substrate results in surface roughness due to the sublimation, causing disadvantages such as warpage of the substrate. In the present embodiment, these disadvantages can be eliminated by forming second protecting film 20. Thereby, a large-diameter substrate can be realized. The diameter of silicon carbide substrate 100 is more preferably greater than or equal to 125 mm (for example, greater than or equal to 5 inches), and particularly preferably greater than or equal to 150 mm (for example, greater than or equal to 6 inches). In addition, the thickness of silicon carbide substrate 100 is more preferably less than or equal to 400 μm, and particularly preferably less than or equal to 300 μm. This can further reduce the cost of the silicon carbide semiconductor device.

The thickness of second protecting film 20 is preferably greater than or equal to 0.5 μm from the viewpoint of preventing the surface roughness of second main surface P2, and can be substantially the same as that of first protecting film 10, for example.

It is preferable that second protecting film 20 be an organic film. This is because an organic film becomes a carbon film by being carbonized in a temperature increasing process of activation annealing, and can have heat resistance to resist the activation annealing. In particular, it is preferable to use the same organic film as first protecting film 10. This is suitable from the viewpoint of manufacturing cost since second protecting film 20 can be formed without an increase in the number of components.

Alternatively, second protecting film 20 may be a DLC film. A DLC film can be formed by ECR sputtering, for example. Alternatively, second protecting film 20 may be a carbon layer formed by partially removing silicon from silicon carbide substrate 100. A carbon layer can be formed, for example, by performing thermal etching on second main surface P2 at a temperature greater than or equal to 700° C. and less than or equal to 1000° C. under a reactive gas atmosphere including chlorine ($Cl_2$) to thereby partially (selectively) remove silicon from second main surface P2. As such, whether second protecting film 20 is a DLC film or a carbon layer, the surface roughness of second main surface P2 can be suppressed to prevent the disadvantages such as substrate warpage.

After the activation annealing (step S5), second protecting film 20 can be removed with a conventionally known process such as ashing, etching, and wet cleaning.

Figure 13:
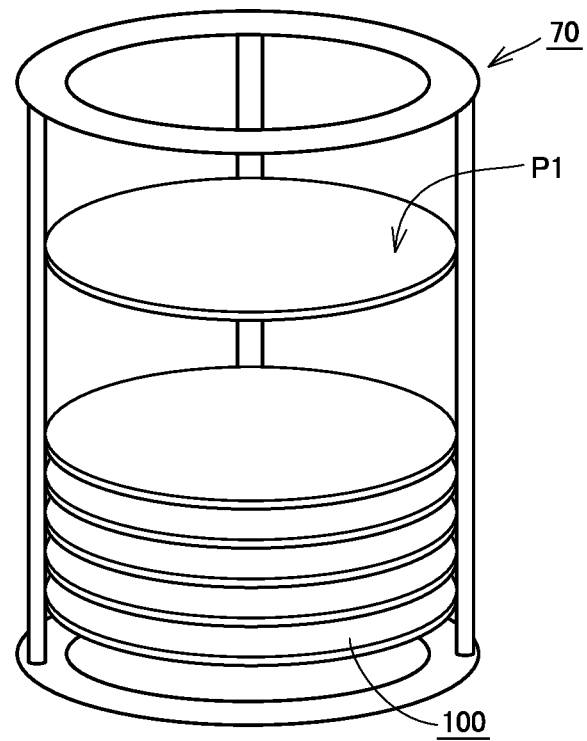
FIG. 13 is a schematic perspective view illustrating a jig according to the method of manufacturing the silicon carbide semiconductor device of the embodiment.

While the activation annealing (step S5) is usually performed with second main surface P2 being in close contact with a susceptor or the like in order to prevent the surface roughness of second main surface P2, forming second protecting film 20 allows for annealing with second main surface P2 being in an open state. For example, a plurality of silicon carbide substrates 100 can be annealed while being stacked and held in a prescribed jig 70 as shown in FIG. 13, for example. That is, the plurality of silicon carbide substrates 100 are prepared in preparing step S1, and in activating step S5, the plurality of silicon carbide substrates 100 can be annealed while being held with spacing between each of the substrates along a direction intersecting with first main surface P1. This can significantly improve the processing efficiency of activation annealing, thereby reducing the cost of manufacturing the silicon carbide semiconductor device.

While the present embodiment has been described above, it is also originally intended to combine the configurations of the embodiments described above with one another.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST

10 first protecting film; 20 second protecting film; 41 first mask layer; 42 second mask layer; 43 third mask layer; 51 first opening; 52 second opening; 53 third opening; 70 jig; 80 silicon carbide single-crystal substrate; 81 silicon carbide epitaxial layer; 82 p body layer; 83 n+ layer; 84 p contact region; 91 gate insulating film; 92 gate electrode; 93 interlayer insulating film; 94 source electrode; 95 source wiring layer; 96 drain electrode; 100 silicon carbide substrate; P1 first main surface; P2 second main surface.

The invention claimed is:

1. A method of manufacturing a silicon carbide semiconductor device, comprising the steps of:
   preparing a silicon carbide substrate having a first main surface and a second main surface located opposite to the first main surface;
   forming a doped region in the silicon carbide substrate by doping the first main surface with an impurity;
   forming a first protecting film on the doped region at the first main surface; and
   activating the impurity included in the doped region by annealing with the first protecting film having been formed,
   the step of forming a first protecting film including the step of coating a resin material, which will form the first protecting film and in which the concentration of a metal element is less than or equal to 5 μg/kg, on the first main surface.

2. The method of manufacturing a silicon carbide semiconductor device according to claim 1, wherein
   the density of the metal element per unit area in a surface of the first protecting film is less than or equal to 1E10 atoms/cm$^2$.

3. The method of manufacturing a silicon carbide semiconductor device according to claim 1, wherein
   the resin material comprises a resin selected from the group consisting of an acrylic resin, a phenolic resin, a urea resin, and an epoxy resin.

4. The method of manufacturing a silicon carbide semiconductor device according to claim 1, wherein
   the metal element is sodium.

5. The method of manufacturing a silicon carbide semiconductor device according to claim 1, further comprising the step of forming a second protecting film on the second main surface before the activating step, wherein
   in the activating step, the annealing is performed with the first protecting film having been formed, and with the second protecting film also having been formed.

6. The method of manufacturing a silicon carbide semiconductor device according to claim 1, wherein
   the resin material comprises a photosensitive resin.

7. The method of manufacturing a silicon carbide semiconductor device according to claim 1, wherein
   the resin material comprises a photoresist.

\* \* \* \* \*